(12) United States Patent
Park et al.

(10) Patent No.: US 7,611,584 B2
(45) Date of Patent: Nov. 3, 2009

(54) ELECTROLESS METAL FILM-PLATING SYSTEM

(75) Inventors: Myung Ho Park, Suwon (KR); Woon Soo Kim, Yongin (KR); Min Keun Seo, Yongin (KR)

(73) Assignee: LG Electronics Inc., Seoul (KR)

( * ) Notice: Subject to any disclaimer, the term of this patent is extended or adjusted under 35 U.S.C. 154(b) by 60 days.

(21) Appl. No.: 11/354,036

(22) Filed: Feb. 15, 2006

(65) Prior Publication Data

US 2007/0131164 A1 Jun. 14, 2007

(30) Foreign Application Priority Data

Dec. 13, 2005 (KR) ...................... 10-2005-0122340
Dec. 13, 2005 (KR) ...................... 10-2005-0122341

(51) Int. Cl.
*B05C 3/12* (2006.01)
*B05C 3/132* (2006.01)

(52) U.S. Cl. ........................ 118/411; 118/412; 118/423; 118/429; 204/206; 204/207; 204/208; 204/209; 204/210; 266/112

(58) Field of Classification Search ................. 118/411, 118/412, 423, 429; 204/269, 206–210; 427/301, 427/304, 307, 443.1; 205/138; 266/112; 493/328, 329, 330
See application file for complete search history.

(56) References Cited

U.S. PATENT DOCUMENTS

| | | | |
|---|---|---|---|
| 2,639,244 A * | 5/1953 | Vordahl et al. | ............... 148/242 |
| 3,791,853 A * | 2/1974 | Lauriente et al. | ............... 52/108 |
| 4,825,241 A | 4/1989 | Saijo et al. | |
| 4,867,099 A * | 9/1989 | Heine et al. | .................. 118/630 |
| 6,764,641 B2 * | 7/2004 | Legoupil | ..................... 266/107 |
| 6,991,717 B2 | 1/2006 | King et al. | |
| 2006/0116268 A1 | 6/2006 | King et al. | |

FOREIGN PATENT DOCUMENTS

| | | |
|---|---|---|
| JP | 63-24268 U | 2/1988 |
| JP | 04-180572 A | 6/1992 |
| JP | 04-293786 A | 10/1992 |
| JP | 08-039728 A | 2/1996 |
| JP | 2002-080151 A | 3/2002 |
| JP | 2003-055782 A | 2/2003 |
| JP | 2003-183886 A | 7/2003 |
| JP | 2004-018948 A | 1/2004 |
| JP | 2004-052032 A | 2/2004 |
| JP | 2005-522586 A | 7/2005 |

* cited by examiner

*Primary Examiner*—Laura Edwards
(74) *Attorney, Agent, or Firm*—Birch, Stewart, Kolasch & Birch, LLP

(57) ABSTRACT

A metal film-plating system including an unwinding process part configured to provide a film, a degreasing process part configured to remove impurities from the film, an etching process part configured to perform an etching process on the film, a neutralizing process part configured to perform a neutralizing process on the film, a coupling process part configured to couple the neutralized film with a coupling agent, a catalyst-adding process part configured to adsorb a catalyst onto the coupled film, an underplating process part configured to perform an underplating process on the film, and a plating process part configured to perform a plating process on the film. Further, at least one of the unwinding process part, the degreasing process part, the etching process part, the neutralizing process part, the coupling process part, the catalyst-adding process part, the underplating process part, and the plating process part includes a wetting apparatus configured to perform a wetting operation.

19 Claims, 12 Drawing Sheets

[FIG.1]
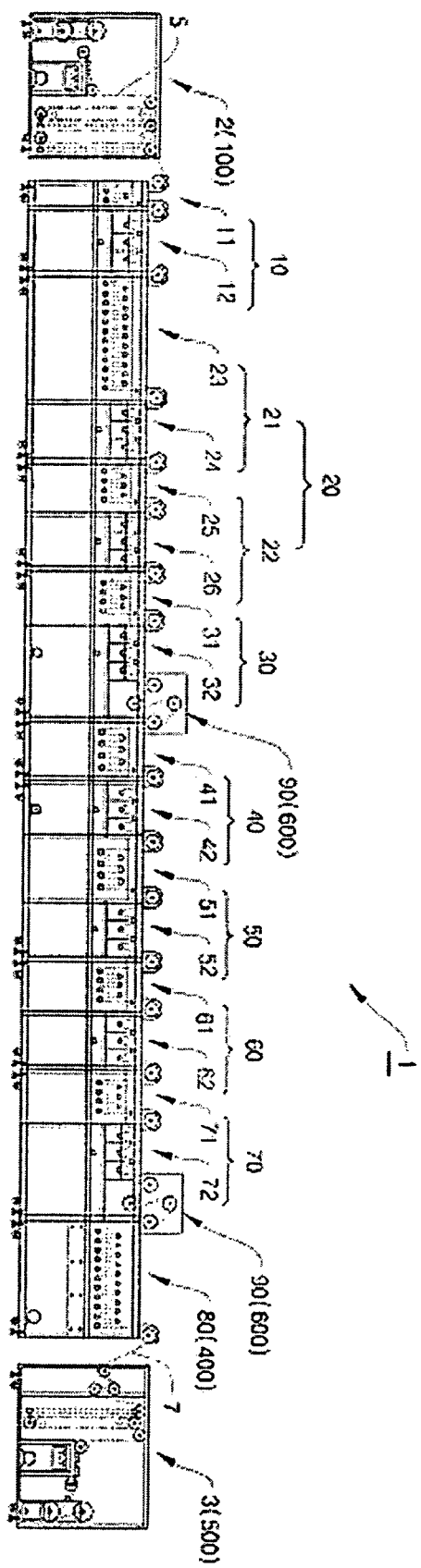

[FIG.2]
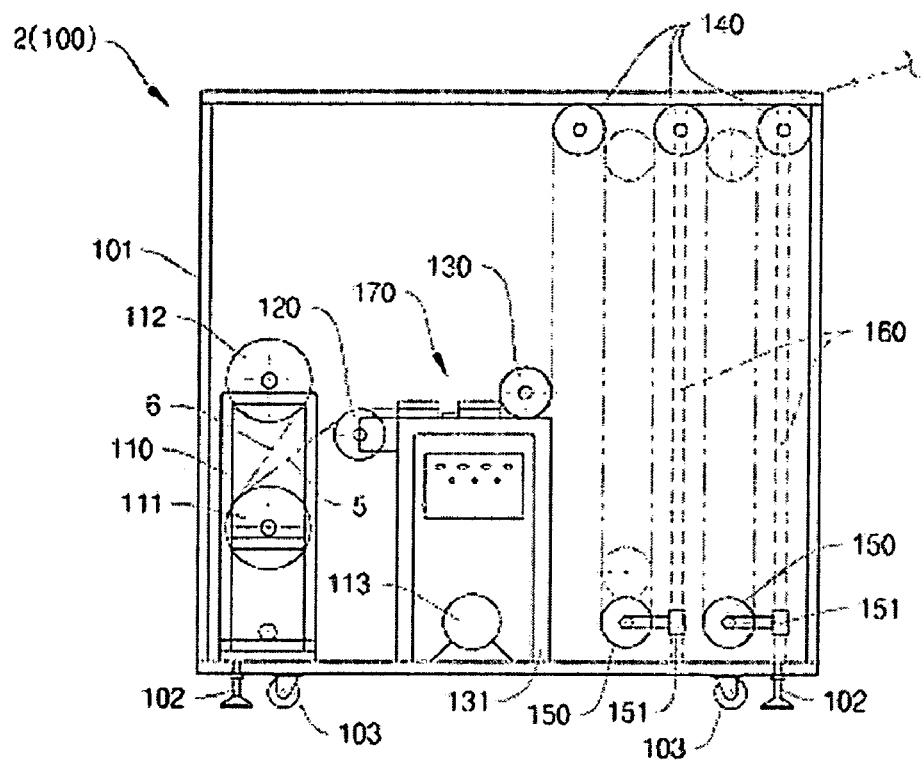
[FIG.3]
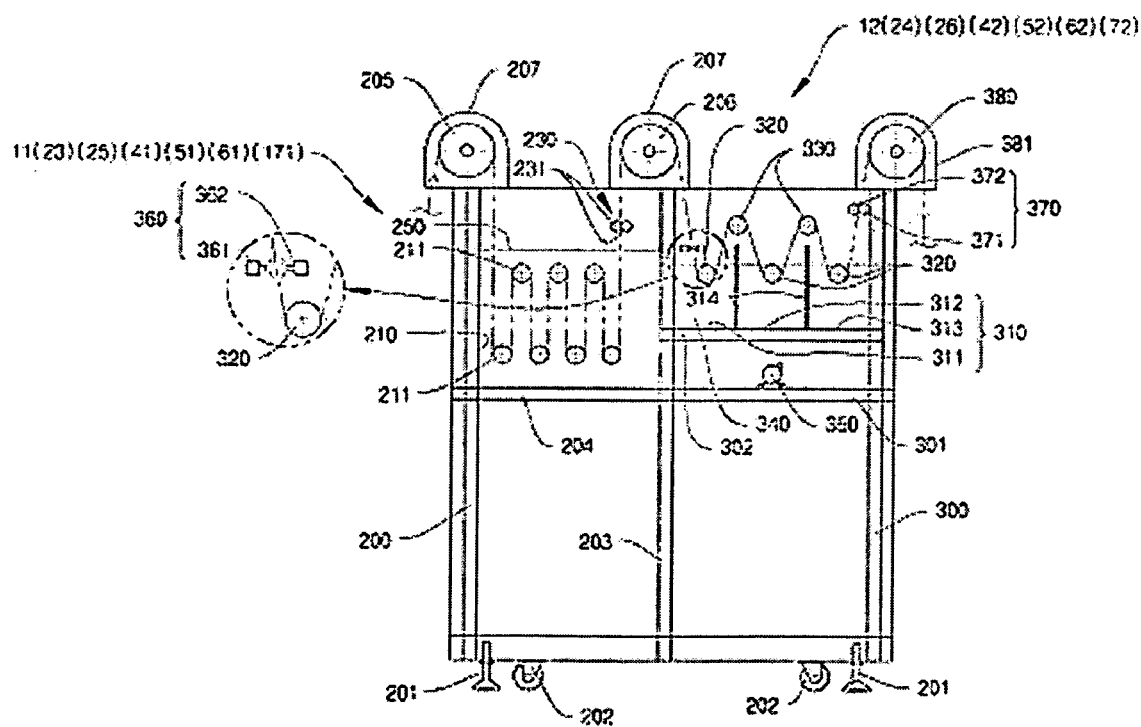

[FIG.4]
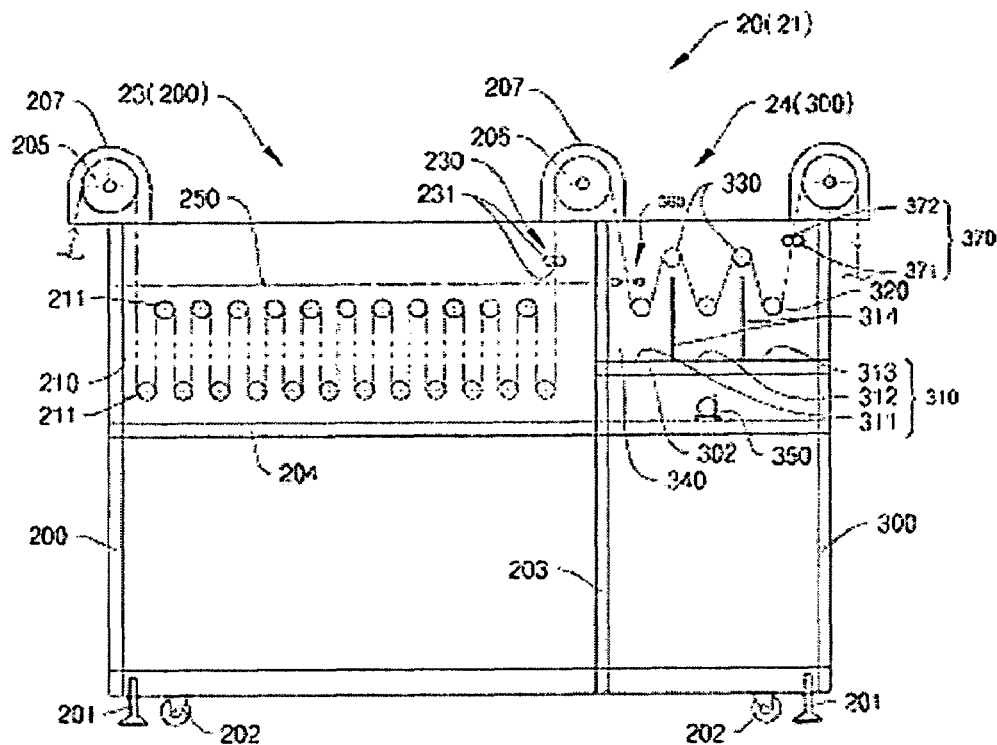
[FIG.5]
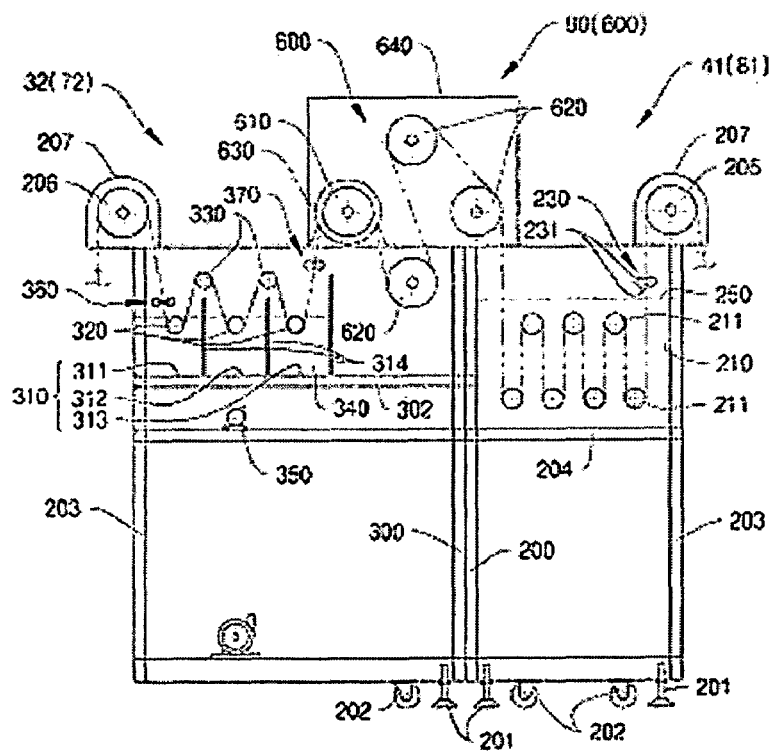

[FIG.6]
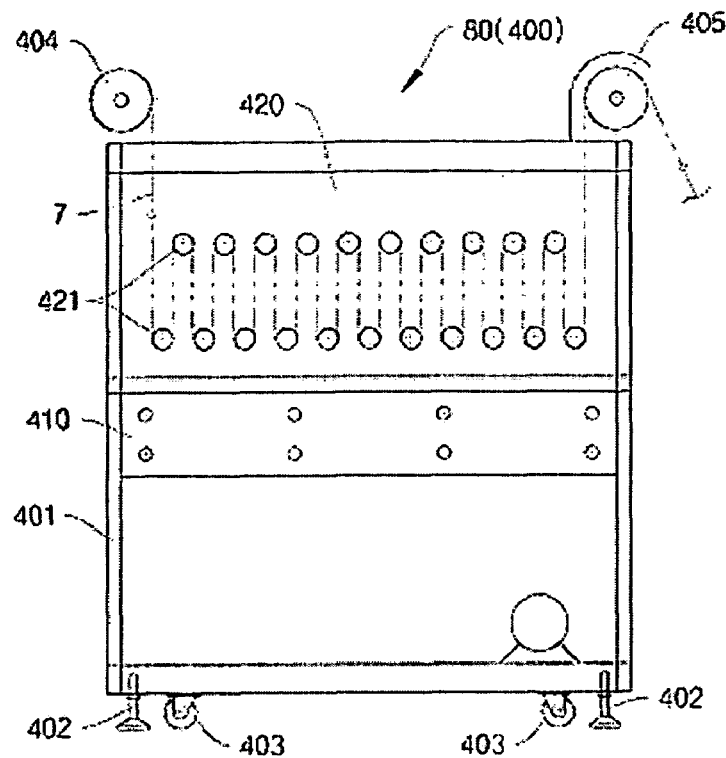
[FIG.7]
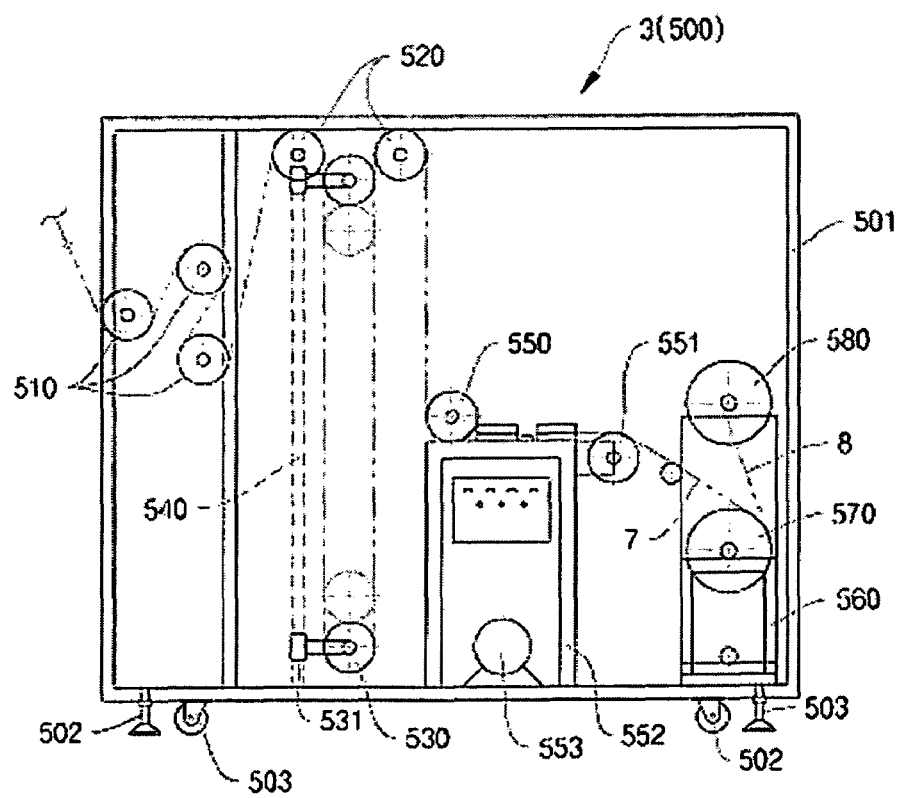

[FIG.8a]
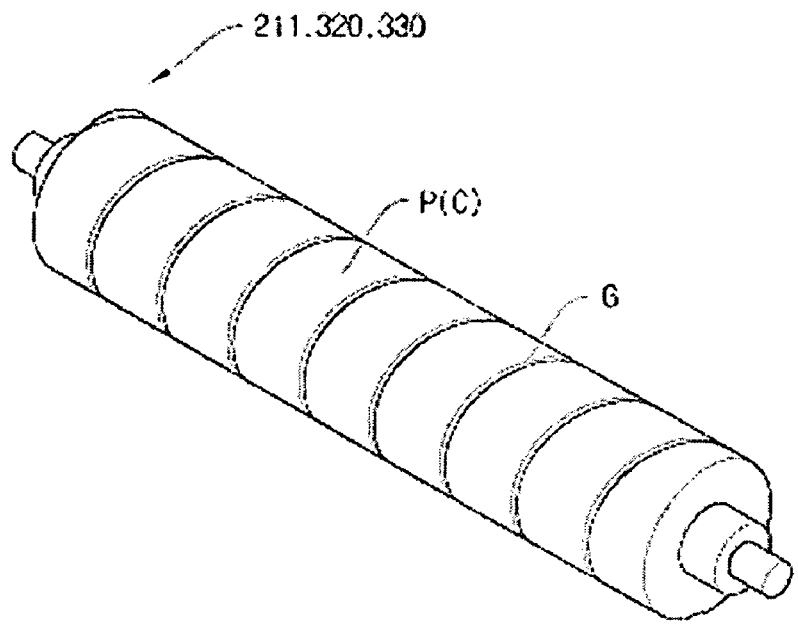
[FIG.8b]
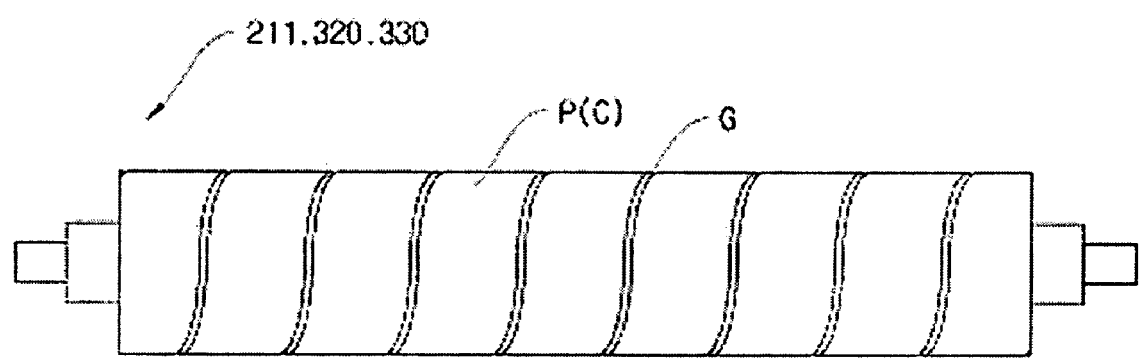

[FIG.9a]
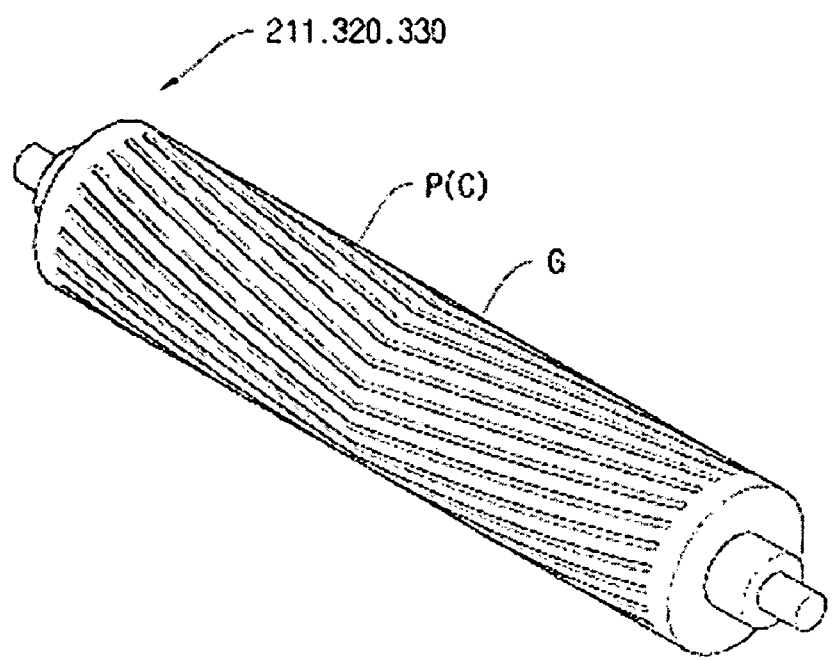
211,320,330
P(C)
G
[FIG.9b]
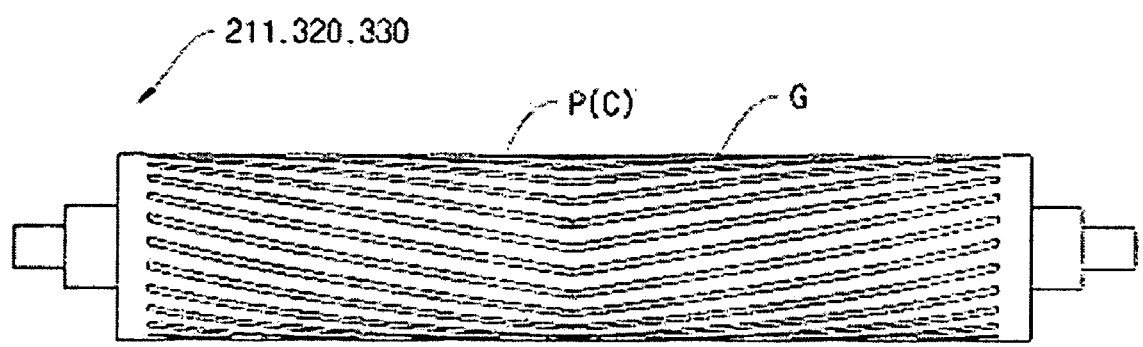
211,320,330
P(C)
G

[FIG.10a]
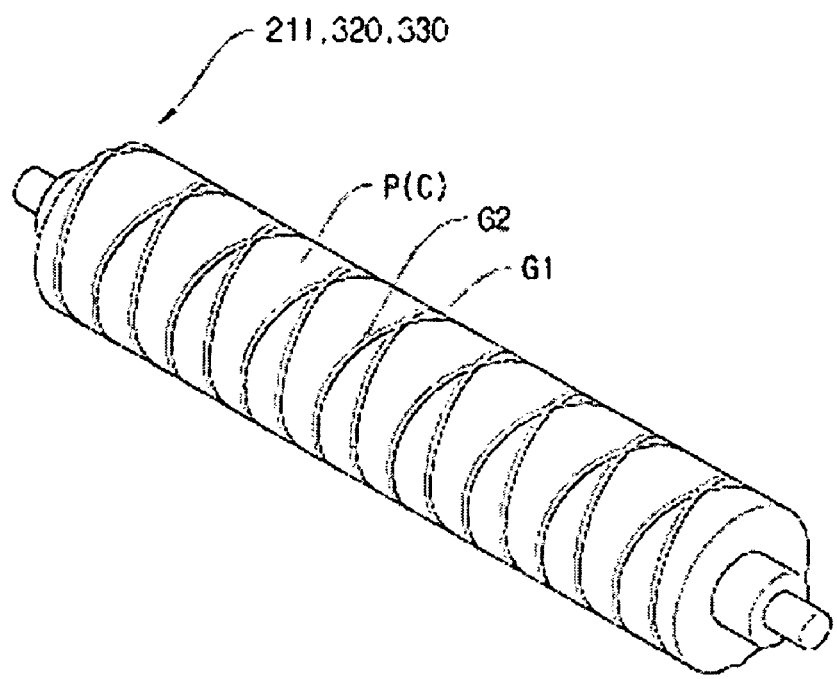
[FIG.10b]
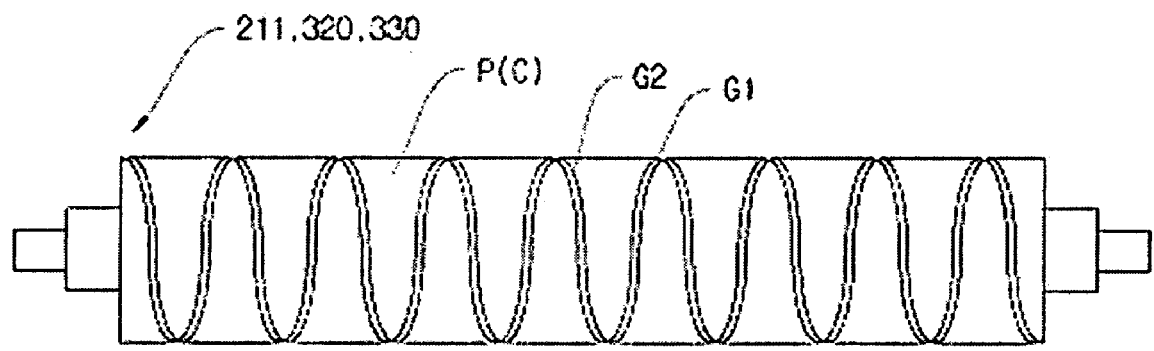

[FIG.11a]
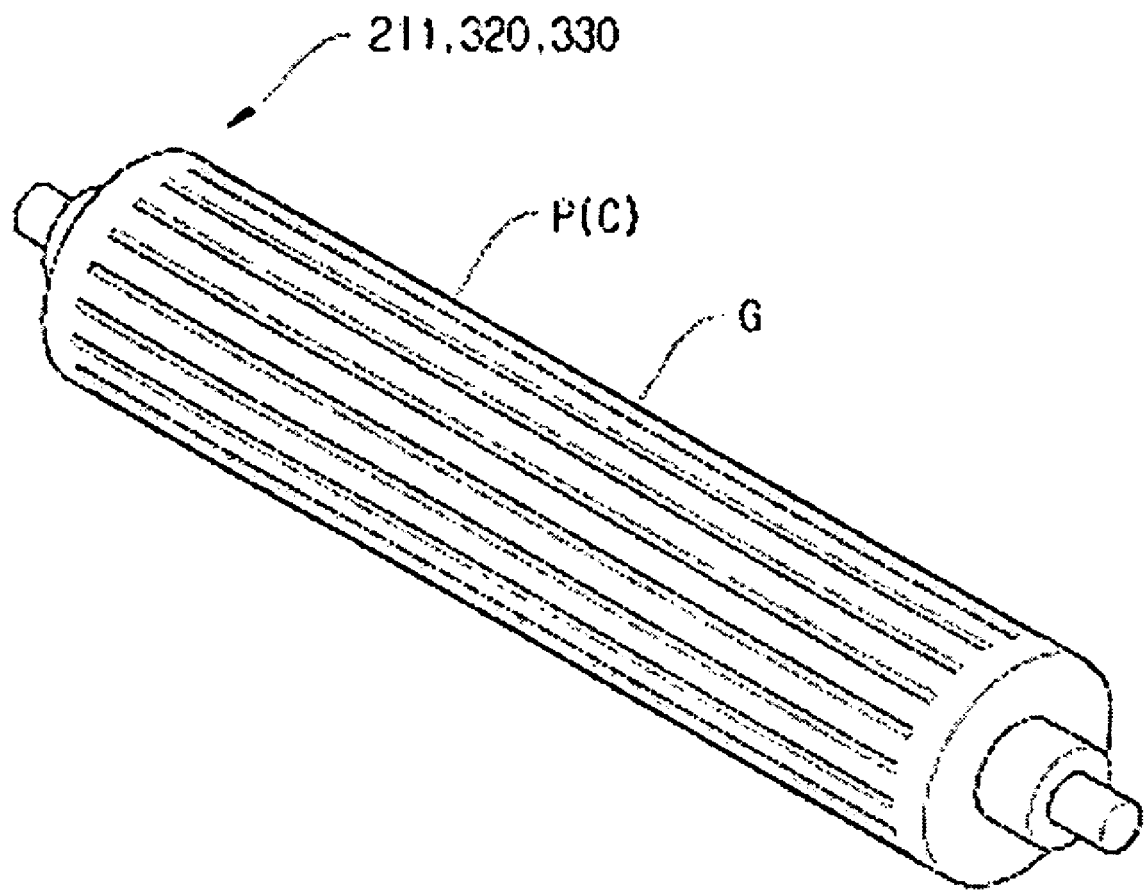

[FIG.12b]
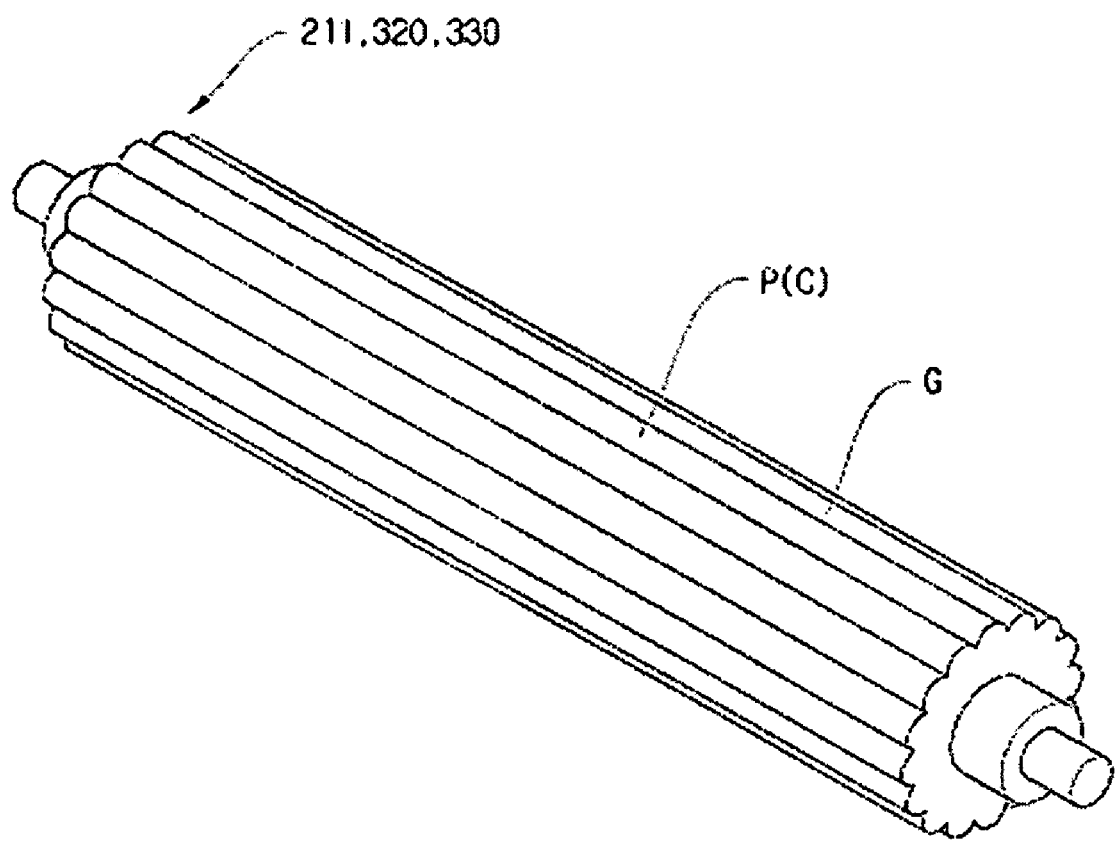

[FIG.13a]
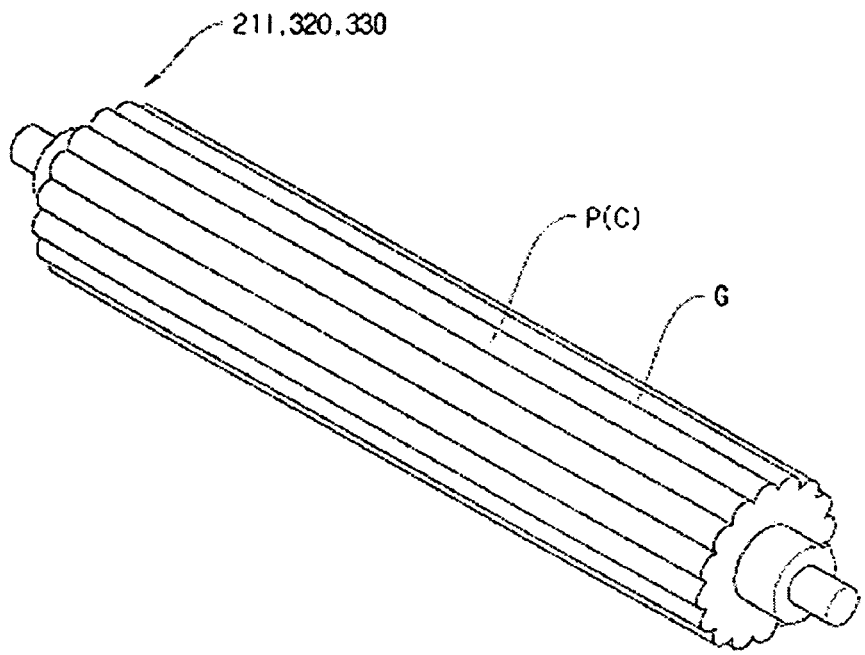
[FIG.13b]
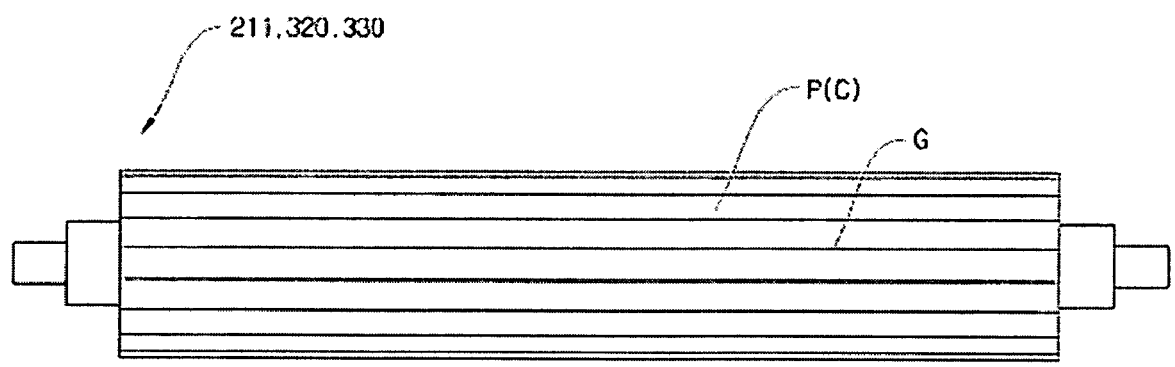

ELECTROLESS METAL FILM-PLATING SYSTEM

BACKGROUND OF THE INVENTION

1. Field of the Invention

The present invention relates to an electroless metal film-plating system in which, while a roll of film (polyimide film) is continuously fed, one or both surfaces thereof are plated with conductive metal in a wetting manner. More particularly, the present invention relates to an electroless metal film-plating system in which, while polyimide film is continuously fed from a roll, a series of wetting process, including a degreasing process, an etching process, a neutralizing process, a coupling process, a catalyst-adding process, an electroless undercoating process, and a plating process, are conducted, in order, so as to plate one or both surfaces of the film with conductive metal, followed by drying the conductive metal-plated film and taking up the plated film into a roll.

2. Description of the Prior Art

A conductive metal-plated film (e.g., polyimide film), of which a flexible copper clad laminate (hereinafter referred to as "FCCL") is representative, is the most essential for flexible Printed Circuits (hereinafter referred to as "FPCs").

In FPCs, generally, a polyester, a polyimide, a liquid crystal polymer, or a fluorine resin film is employed as an insulating film, with a polyimide film being preferred due to its superiority in thermal resistance, dimensional stability and solderability.

A conductive metallic material suitable to be layered on the insulation film (polyimide film) should be low in electrical resistance and show high conductivity, and examples thereof include gold and copper, with preference for copper due to its low cost.

FCCL, comprising a polyimide film and a conductive metal film (copper thin film) layered thereon, may be largely divided into two types: a trilayer structure consisting of a polyimide film, an adhesive layer, and a conductive metal film (copper); and a bilayer structure consisting of a polyimide film and a conductive metal film (copper).

However, the trilayer structure FCCL does not allow the formation of fine patterns without great difficulty and is also poor in flexibility. In addition, the low thermal resistance of the adhesive layer prohibits the execution of high-temperature processes such as soldering. For these reasons, the bilayer structure FCCL is preferred.

For the fabrication of FCCL, laminating, casting or plating methods are current used.

In a laminating method, liquid polyimide as an adhesive is applied to a polyimide film and fixed thereon by heating in oven, and a copper thin film is placed on the adhesive and pressed against the adhesive to fabricate an FCCL.

A casting method comprises layering liquid polyimide on a copper thin film and casting the resulting structure to afford an FCCL.

As for a plating method, it is conducted in a plating condition for forming a copper layer on a polyimide film.

Of these FCCL fabricating methods, the laminating method and the casting method are problematic in that uses for polyimide films and adhesives are limited.

In contrast, the plating method enjoys the advantages of needing no commercialized copper thin films and being able to control the thickness of copper thin film upon plating.

However, the FCCL fabricated by conventional plating methods exhibits relatively poor physical properties, such as peel strength, than does that fabricated by other methods. Therefore, there is an urgent need for a conductive metal-plated polyimide film, such as FCCL, that is greatly improved in physical properties including peel strength.

Generally, a rotating roller installed in a fabrication apparatus of FCCL has a cylindrical roller portion whose surface is made from rubber, with an axis inserted at the center thereof.

As driving rollers operate, conveying rollers are rotated to transport a target to be processed, such as a film.

For example, when a conveying roller rotates at a speed of 310 rpm, the film is conveyed while being in close contact with the roller. During rotation, heat is generated in the roller due to friction, resulting in an increase in the surface temperature of the roller.

Hence, the film in close contact with the roller may be temporarily adhered to the roller due to the heat or pressure of the roller, so that it cannot proceed, but turns together with the conveying roller. As a result, the film is rolled until it becomes tangled or broken.

When a film is conveyed by conventional rollers in liquid, it occasionally slips from the rollers because the liquid between the film and the rollers is insufficiently drained. In the case that rollers for conveying a film are submerged in liquid while they rotate, liquid is excluded from the surface of the rollers.

When a roller transports a film by rotation, a high coefficient of friction is generated between the film and the roller if it is dry. The existence of water between the film and the roller decreases the coefficient of friction because the water serves as a lubricant. If the rotation speed of the roller is increased without the proper draining of the liquid, the film is not directly contacted with the surface of the roller and undergoes hydroplaning. As a result, the film slips from the roller.

Therefore, where a roller rotates in liquid or with its surface wetted, the roller does not function properly because the film slips from the roller and is damaged.

SUMMARY OF THE INVENTION

Accordingly, the present invention has been made keeping in mind the above problems occurring in the prior art, and an object of the present invention is to provide an electroless metal film-plating system in which a conductive metal-plated film exhibiting superior physical properties can be produced.

Another object of the present invention is to provide an electroless metal film-plating system in which, while polyimide film is continuously fed from a roll, a series of wetting process parts, including a degreasing process part, an etching process part, a neutralizing process part, a coupling process part, a catalyst-adding process part, an undercoating process, and a plating process part, are continuously operated, in order, so as to plate one or both surfaces of the film with conductive metal, followed by drying the conductive metal-plated film in the drying process part and taking up the plated film into a roll in the winding process part.

A further object of the present invention is to provide an electroless metal film-plating system in which a wetting process, by which the film passes through a liquid solution and is repetitively immersed in and drawn from a washing solution and is washed using a water spraying means after immersion in liquid in each process, is applied to a degreasing process part, an etching process part, a neutralizing process part, a coupling process part, a catalyst-adding process part, an undercoating process, and a plating process part, so as to produce a bilayer structure FCCL exhibiting superior physical properties such as peel strength.

Still a further object of the present invention is to provide an electroless metal film-plating system in which, when a wetting process, by which the film passes through a liquid solution and is repetitively immersed in and drawn from a washing solution, is applied to a degreasing process part, an etching process part, a neutralizing process part, a coupling process part, a catalyst-adding process part, an undercoating process and a plating process part, the immersion time period is controlled according to process part and after immersion in liquid in each process, the liquid is removed using wringing rollers so as to coat the material of interest at a uniform thickness.

Still another object of the present invention is to provide an electroless metal film-plating system in which roller assemblies comprising a plurality of fixed rollers and a plurality of movable rollers are employed in an unwinding process for feeding the film and a winding process for taking up the film to control the tension of the film, thereby transporting the film without causing twisting or distortion, and one or more auxiliary operating process parts are provided to facilitate the transfer of the film.

Yet another object of the present invention is to provide an electroless metal film-plating system in which rollers having grooves formed thereon are employed to convey a film, whereby even when the rollers are rotated in liquid, liquid is properly drained through the grooves that hydroplaning does not occur between the film and the rollers, thereby preventing the film from slipping from the rollers.

The above objects of the present invention can be accomplished by the provision of an electroless metal film-plating system, comprising: an unwinding process part 2 in which a taking-out apparatus 100 is installed to unwind a release paper-backed film 5 from a substrate roller 111 while stripping the paper-backed film of release paper 6 and to feed the stripped film; a degreasing process part 10 in which a degreasing apparatus 11 and a washing apparatus 12 are installed to removing impurities from the film 5 fed from the unwinding process part 2 by degreasing and washing; an etching process part 20 in which a first and a second etching apparatus 23, 25 and washing apparatuses 24, 26 are installed to repetitively etch and wash the degreased film 5; a neutralizing process part 30 in which a neutralizing apparatus 31 and a washing apparatus 32 are installed to neutralize and wash the surface-etched film 5; a coupling process part 40 in which a coupling apparatus 41 and an acid-washing apparatus 42 are installed to couple the neutralized film with an coupling agent and wash the film with acid, respectively; a catalyst-adding process part 50 in which an activating apparatus 51 and a washing apparatus 52 are installed to adsorb a catalyst onto the surface-coupled film 5 and wash the film, respectively; an underplating process part 60 in which an underplating apparatus 61 and a washing apparatus 62 are installed to form a first conductive metal film on the catalyst-adsorbed film 5 and washing the film 5, respectively; a plating process part 70 in which a plating apparatus 71 and a washing apparatus 72 are installed to form a second conductive metal film on the first-conductive metal-plated film, with an electric field applied to the plating apparatus and wash the film, respectively; a drying process part 80 in which a drying apparatus 400 is installed to dry the second conductive metal-plated film 5; an auxiliary operating part 90, positioned between predetermined process parts, in which an auxiliary driving apparatus 600 is installed to power the film traveling over all processes; and a winding process part 3 in which a winding apparatus 500 is installed to back the second metal-plated film with a release paper to afford a conductive metal-plated film 7 and to wind the conductive metal-plated film around a taking-up roller 560.

BRIEF DESCRIPTION OF THE DRAWINGS

The above and other objects, features and advantages of the present invention will be more clearly understood from the following detailed description taken in conjunction with the accompanying drawings, in which:

FIG. 1 is a schematic view showing the process flow of an electroless metal film-plating system in accordance with the present invention;

FIG. 2 is partially enlarged view of the unwinding process part in accordance with an embodiment the present invention;

FIG. 3 is partially enlarged view showing particular portions of an electroless metal film-plating system in accordance with an embodiment the present invention;

FIG. 4 is partially enlarged view of the etching process part in accordance with an embodiment the present invention;

FIG. 5 is partially enlarged view of the auxiliary operating part in accordance with an embodiment the present invention;

FIG. 6 is partially enlarged view of the drying process Part in accordance with an embodiment the present invention;

FIG. 7 is partially enlarged view of the winding process part in accordance with the present invention;

FIGS. 8a and 8b are perspective view and front view of a roller in accordance with a fist embodiment of the present invention;

FIGS. 9a and 9b are perspective view and front view of a roller in accordance with a second embodiment of the present invention;

FIGS. 10a and 10b are perspective view and front view of a roller in accordance with a third embodiment of the Present invention;

FIGS. 11a and 11b are perspective view and front view of a roller in accordance with a fourth embodiment of the present invention;

FIGS. 12a and 12b are perspective view and front view of a roller in accordance with a fifth embodiment of the present invention; and FIGS. 13a and 13b are perspective view and front view of a roller in accordance with a sixth embodiment of the present invention.

DETAILED DESCRIPTION OF THE INVENTION

Figure 11B:
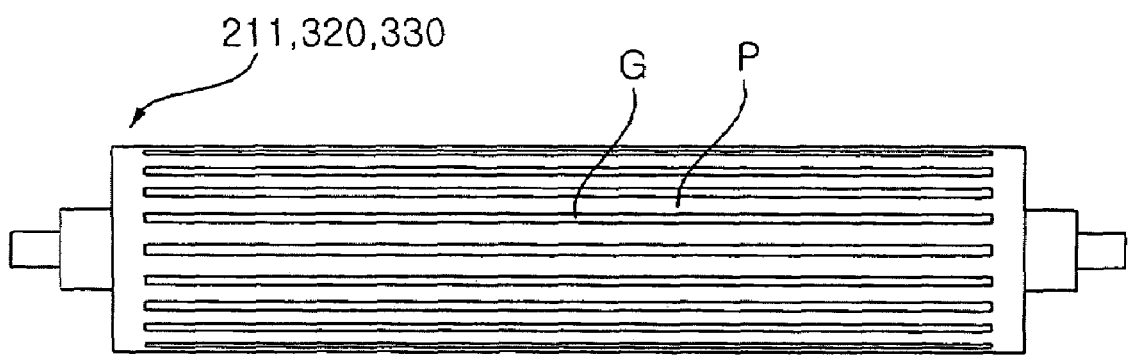

Reference should now be made to the drawings, in which the same reference numerals are used throughout the different drawings to designate the same or similar components.

The structure and process of an electroless metal film-plating system according to the present invention are illustrated in FIGS. 1 to 13b, which show a process flow in FIG. 1, particular portions in enlarged vies of FIGS. 2 to 7, and rollers suitable for use in the invention in perspective views and front views of FIGS. 8a to 13b.

As seen in the figures, the electroless metal film-plating system 1 in accordance with the present invention comprises an unwinding process part 2, in which a film 5 wound around a substrate roller 111 is taken out and fed; a degreasing process part 10, in which oils are removed from the surface of the film 5 provided by the unwinding process part 2; an etching process part 20 in which the degreased surface of the film 5 is repetitively etched; a neutralizing process part 30, in which the surface-etched film 5 is neutralized; a coupling process part 40, in which the neutralized film 5 is coupled; a catalyst-adding process part 50, in which a catalyst is adsorbed onto the surface-coupled film 5; an underplating process part 60, in which a first conductive metal film is formed on the catalyst-adsorbed film 5; a plating process part 70, in which a second conductive metal film is formed atop the first-conductive metal film of the film; a drying process part 80, in which the film plated with the second conductive metal film is dried; and a winding process part 3, in which the dried conductive metal film-plated polyimide substrate 7 thus obtained is wound around a taking-up roller 460, in order, and an auxiliary operating part 90, positioned between predetermined process parts, for aiding to convey the film 5 over all processes.

Unwinding Process Part 2 for Taking Out Film 5 Wound Around Substrate Roll 111

The unwinding process part 2, as shown in FIG. 2, is entirely operated by a taking-out apparatus 100, which is structured as follows.

The taking-out apparatus 100 is housed within a frame 101 formed in the form of a rectangular parallelepiped. The frame 101 has a leg 102 for fixedly supporting the frame on the ground and a caster 103 for readily carrying the frame on the outer surface of the bottom at each corner.

A substrate roll-mounting stand 110, set at an inlet position inside the frame 101, has, at an upper position, a release paper-recovering roller 112 for winding paper 6 released from the film 5 and, at a lower position, a detachably mounted substrate roller 111, around which the film 5 backed by the release paper 6 is wound.

A table 131, provided at a middle position inside the frame 101, has a supply-guiding roller 120, an end-connecting unit 170, and a diverting roller 130 formed in order at an upper site, and a driving motor 113 therein at a lower site. In association with pulleys, belts or sprockets, and chains, although not shown, the driving motor 113 operates to rotate the axis of the substrate roller 111, functioning to take out and provide the film 5 to the next process part.

The film 5 unwound from the substrate roller 11 is guided by the supply-guiding roller 120. The end-connecting unit 170 is provided for integrally melt-fusing the rear end of a preceding film to the forward end of a following film. While traveling, the film 5 has a direction changed upwards by the diverting roller 130.

At an outlet position inside the frame 101 is provided a tension controlling assembly for controlling the tension of the film 5, which comprises a plurality of fixed rollers 140 and at least one movable roller 150. The fixed rollers 140 are fixed on shafts which are fixedly arranged at regular intervals at upper positions of the frame while the movable roller 150 is adapted to move up and down between the fixed rollers 140. The movable roller 150 is fixed on an axle engaged with a movable rack 151 which is combined with a pair of vertically parallel guide rails 160 so that the movable rack 151 moves up and down along the guide rails 160, thereby controlling the elevation of the movable rollers 150.

Degreasing Process Part 10 for Removing Oil from the Surface of the Film 5

The degreasing process part 10 is adapted to remove impurities formed or adsorbed on the film 5, such as contaminants, oils, fingerprints, etc., in order to prevent a decrease of FCCL in peel strength, which may occur due to the impurities.

As shown in FIG. 3, the degreasing process part 10 consists mainly of a degreasing apparatus for removing impurities, such as contaminants, oils, fingerprints, etc., from the surface of the film 5, and a washing apparatus 12 for washing the surface-degreased film 5 with water.

The degreasing apparatus 11 and the washing apparatus 12 are respectively housed in a functional apparatus frame 200 and a washing apparatus frame 300, which may be separated from each other or integrated with each other as shown.

On the outer surface of the frames at each corner, a leg 201 and a caster 202 are provided for fixedly supporting the frames on the ground and readily carrying the frames, respectively. If the frames are integrated into each other, the resulting space may be sectioned by a septum wall 203 into two compartments for housing the degreasing apparatus 11 and the washing apparatus therein, respectively. In order to guide the introduction and discharge of the film 5, a transfer roller 206 covered with a cover 207 is provided at an upper end of the septum wall 203 and the forward/rear ends of the integrated frame.

The degreasing apparatus 11 comprises a top-open liquid bath 210 supported on a support 204 within the functional apparatus compartment 200. The bath 210 contains a degreasing liquid 250 in which conveying rollers 211 are arranged at upper and lower positions in an alternating manner, so that the film 5 travels a zigzag path in upward and downward directions within the solution.

A wringing means 230 comprising a pair of rollers 231 is provided above the surface of the degreasing solution so that the film 5 emerging out of the last one of the conveying rollers 211 is allowed to pass between the pair of rollers 231 to squeeze the liquid from the film 5.

The space defined by the septum wall 203 and the washing apparatus frame 300, that is, the washing apparatus compartment is sectioned into three spaces by two horizontal supports 301 and 302 and the upper space defined by the support 302 serves as a washing bath 310 which is further divided into a first, a second and a third washing chamber 311, 312 and 313 by partitions 314. The level of washing water 340 in the washing bath 310 is maintained constantly by a pumping motor 350, installed in the middle space defined by both the supports 301 and 302, which operates to supply washing water.

A washing roller 320 is provided in each of the first, the second and the third washing chamber 311, 312, 313 at such a position as to sufficiently submerge the film 5 in the washing water 340 while a draining roller 330 is provided above each of the partitions 314. Thus, the film 5 is washed upon passing the washing rollers 320 and drained upon passing the draining rollers 330 in an alternating manner.

Particularly, a spray washing means 360 and a wringing means 370 are provided in the first washing chamber 311 and the third washing chamber 313, respectively.

The spray washing means 360, positioned above the surface of the washing water, ahead of the washing rollers 320 in the first washing chamber 311, comprises two spraying nozzles 361 and 362 facing each other. The film introduced into the first washing chamber 311 is allowed to pass between the spraying nozzles 361 and 362 so as to wash the opposite surfaces of the film 5 with the water sprayed from the nozzles 361 and 362.

The wringing means 370, positioned above the surface of the washing water, subsequent to the washing rollers 320, in the third washing chamber 313, comprises a pair of wringing rollers 371 and 372 facing each other at an oblique angle. The wringing rollers 371, 372 are made of resilient, absorptive soft material, such as sponge or foam resin, so as to completely remove water from the surface of the film 5 during the passage of the film 5 therebetween.

The degreasing solution 250 contained in the liquid bath 210 is generally an alkaline rinse or shampoo, but is not particularly limited. It is preferred that degreasing be conducted for 5 min at 20 to 28° C. For example, the degreasing solution is too inactive at a temperature lower than 20° C. to sufficiently degrease the film. On the other hand, it is difficult to control the overall time period of the entire processes when degreasing at 28° C.

Etching Process Part 20 for Etching the Degreased Surface of the Film 5

In the etching process part 20, the degreased surface of the film 5 is modified by etching. As shown in FIG. 1, the etching process part 20 is divided into a first etching process part 21 and a second etching process part 22. For the first etching process part 21, a first etching apparatus 23 and a washing apparatus 24 are employed while the second etching process part 22 is operated by a second etching process 25 and a washing apparatus 26.

The etching apparatuses 23, 25 of the etching process parts 21, 22 are similar in structure to the degreasing apparatus 11 of the degreasing process part 10. Also, structural similarity exists between the washing apparatuses 24, 26 of the etching process parts 21, 22 and the washing apparatus 12 of the degreasing process part 10. Therefore, a detailed description thereof is omitted herein.

Each liquid bath 210 of the first and the second etching apparatus 23, 25 contains an etching solution 250 which is exemplified by chromic anhydride, sulfuric acid, or alkali such as KOH, ethylene glycol or a KOH mixture solution.

Particularly, when the first etching solution contained in the first etching apparatus 23 is chromic anhydride, as shown in FIG. 4, far more conveying rollers 211 are installed in the liquid bath 210 than in other baths so as to sufficiently etch the film with the chrome solution.

The etching process is preferably conducted at 45-50° C. for 5-7 min. The etching solution is too inactive at a temperature lower than 45° C. to achieve a sufficient effect. A time period shorter than 5 min is also insufficient for a good etching result. On the other hand, an etching temperature higher than 50° C. too actively accelerates the etching process to uniformly etch the film the entire surface thereof; as well, it is difficult to control the etching process. In addition, when the etching process is conducted for too long, the polyimide film 5 may be partially damaged.

The etching conducted in the etching process part 20 makes the surface of the film 5 suitable to form close adhesion with a metal layer which is formed upon a subsequent plating process, thereby increasing the peel strength of the film. This is attributable to the fact that upon etching, imide rings of polyimide are opened to expose amide groups (—CONH) or carboxyl groups (—COOH), which are more reactive to metal.

Neutralizing Process Part 30 for Neutralizing the Surface-Etched Film 5

A neutralizing process part 30 is adapted to neutralize the film 5 whose surface is already modified in the etching process part 20. The neutralizing process part 30 comprises a neutralizing apparatus 31 in which a neutralizing solution is contained, and a washing apparatus 32 for washing off the neutralizing solution from the film 5.

The neutralizing apparatus 31 and the washing apparatus 32 has the same structures as those of the degreasing apparatus 10 and the washing apparatus 10 of FIG. 3, respectively, and thus a description of the structures thereof is omitted.

For neutralization, an acidic solution is contained in the liquid bath 210 of the neutralizing apparatus (31) when an alkaline solution is used as an etchant in the etching process part 20 and vice versa. The neutralization is preferably conducted at 10~30° C. At a temperature lower than 10° C., the neutralizing solution is too inactive to sufficiently neutralize the etchant and partially damages the film 5. On the other hand, a temperature higher than causes neutralization at too high a rate to achieve uniform and continuous neutralization over the entire surface of the film.

Upon neutralization in the neutralizing apparatus 31, the $K^+$ or $Cr^{3+}$ ions which remain associated with the amide group (—CONH) or carboxyl group (—COOH) in the etching process part 20 are replaced with $H^+$.

When the coupling process (polarizing process) is conducted, if $K^+$ ions or $Cr^{3+}$ ions remain on the surface of the film 5, they act as competitors with coupling ions for interaction with the amide or carboxyl ions.

Coupling Process Part 40 for Coupling the Neutralized Film 5

This coupling process part 40 is adapted to treat the film modified in the neutralizing process part 30 with a coupling solution to polarize the film, thereby facilitating a subsequent plating process and increasing the peel strength of the film.

The coupling process part 40 comprises a coupling apparatus 41 for combining coupling ions with the opened imide rings on the surface of the film 5 to confer polarity to the film 5, and an acid-washing apparatus 42 for washing the coupled film 5 with acid.

Due to having the same respective structures as in the degreasing apparatus 11 and the washing apparatus 12 of the degreasing process part 10, the structure of the coupling apparatus 41 and the acid-washing apparatus 42 are not further described.

As a coupling solution contained in the liquid bath 210 of the coupling apparatus 41, a silane- or an amine-based coupling agent may be used. The amine-based coupling agent may be alkaline or acidic. A typical alkaline amine-based coupling agent comprises sodium hydroxide and monometal amine. Ethylene diamine and hydrochloric acid are used to prepare an acidic coupling agent.

The reaction conditions of the coupling process depend on properties of the coupling agent used. When a silane-based coupling agent is used, the coupling process is preferably performed at 25-30° C. for 5-7 min.

After being coupled in the coupling apparatus 41, the film 5 is washed with an acidic solution in the acid-washing apparatus 42 to remove the coupling ions which remain uncoupled with opened imide rings on the surface of the film.

When the acid-washing process is conducted for a long period of time or with a highly acidic solution, it is required to properly control the washing condition in order not to remove the coupling ions coupled with the opened imide rings.

Catalyst-Adding Process Part 50 for Adsorbing Catalyst onto Film

In this process part, a metal catalyst is adsorbed to the surface of the film 5 which is coupled (polarized) in the coupling process part 40.

The catalyst-adding process part 50 comprises an activating apparatus 51 for adsorbing a metal catalyst to the surface of the film and a washing apparatus 52 for washing off the active material. Due to having the same respective structures as in the degreasing apparatus 11 and the washing apparatus 12 of the degreasing process part 10, the activating apparatus 51 and the washing apparatus 52 are not further described in regard to their structures.

The liquid bath 210 of the activating apparatus 51 contains a catalyst solution 250 of 1:1 volume mixture of palladium chloride ($PdCl_2$) and tin chloride ($SnCl_2$) in hydrochloric acid.

A proper number of conveying rollers 211 is required in the catalyst-adding process part. If too few conveying rollers 211 are installed in the liquid bath 210, a short reaction time period is set, decreasing the adsorption efficiency of the catalyst solution, which leads to an insufficient catalytic effect. On the other hand, if too long a reaction time is set due to too many conveying rollers 211, the surface of the film 5 may be eroded by the hydrochloric acid of the catalytic solution. Therefore, the number of conveying rollers 211 should be determined in consideration of the reaction time period in the liquid bath.

Underplating Process Part 60 for Forming a First Conductive Metal Film on the Film 5

This process part is adapted to submerge the catalyst-adsorbed film 5 in an underplating solution so as to form a first conductive metal film on the film 5.

The underplating process part 60 comprises an underplating apparatus 61 for plating the film 5 with an underplating solution using an immersion method, and a washing apparatus 62 for washing the underplated film 5. Similar to those of the degreasing apparatus 11 and the washing apparatus 12 of the degreasing process part 10, the structures of the underplating apparatus 61 and the washing apparatus 62 are not further described.

An underplating solution containing in the liquid bath 210 of the underplating apparatus 61 is a copper sulfate solution prepared from a mixture of EDTA, sodium hydroxide, formalin, and copper sulfate in water or a nickel sulfate solution prepared from a mixture of sodium hypophosphite, sodium citrate, ammonia and nickel sulfate in water.

Optionally, the underplating solution may contain a polishing agent and/or a stabilizer so as to improve the properties of the metal plated as well as to allow the underplating solution to be recycled and stored for a long term.

When a copper sulfate solution is employed as the underplating solution, available is an electroless plating method in which the catalyst-adsorbed film 5 is immersed in the underplating solution at 38 to 42° C. for 25 to 30 min without the application of electricity. The thickness of the underplated film (the first conductive metal film) may depend on the plating time period.

Below 38° C., underplating is not performed or is achieved only partially because the underplating solution is not sufficiently active. At a temperature higher than 42° C., on the other hand, the underplating is carried out too fast to afford a plated film (first conductive metal film) which is uniform in thickness and has good adhesion.

When an aqueous nickel sulfate solution is employed as an underplating solution, the catalyst-absorbed film 5 is immersed at 35-40° C. for about 2 min.

Aiming to facilitate a subsequent plating process, the undercoat formed by the underplating process preferably ranges in thickness from 0.1 μm to 0.2 μm. The underplating process is conducted until no areas remain uncoated.

Plating Process Part 70 for Forming a Second Conductive Metal Film on the First Conductive Metal Film-Coated Metal Film 5

This process part is adapted to plate the underplated (first conductive metal film-coated) film 5 with a second conductive metal in the presence of electricity. In the process part, an electroplating apparatus 71 responsible for plating the film with a plating solution is installed, along with a washing apparatus 72 for washing off excess plating solution from the film.

Similar to those of the degreasing apparatus 11 and the washing apparatus 12 of the degreasing process part 10, the structures of the electroplating apparatus 71 and the washing apparatus 72 are not further described.

As a liquid 250 to be contained in a bath 210 of the electroplating apparatus 71, a commercially available plating solution, such as Enthone OMI, HeeSung Metal Co. Korea, or NMP, or a plating solution prepared from a dilution of a mixture of copper sulfate ($CuSO_4$—$H_2O$), sulfuric acid ($H_2SO_4$) and hydrochloric acid (HCl) in water (deionized water) may be used. To the plating solution, a polishing agent and/or an additive may be added in small amounts.

While a current of 2 $A/dm^2$ is applied to the electroplating apparatus 71, the film 5 submerged in the plating solution is plated at 40 to 45° C. for about 30 min with a copper film (second conductive film).

Preferably, the plating solution of the electroplating apparatus 71 is actively stirred to maintain a uniform concentration thereupon. Plating conditions may be modulated according to the thickness of copper film (second conductive metal film) to be formed.

Drying Process Part 80 for Drying the Second Conductive Metal Film-Plated Film 5

Using a drying apparatus 400, this process is adapted to dry the film plated with a copper film (second conductive metal film) so as to produce a bilayer structure FCCL.

The drying apparatus 400 has the structure shown in FIG. 6.

Housing the drying apparatus 400, a frame 401 in the form of a rectangular parallelepiped has an introducing transfer roller 404 for introducing the film therein and a discharging transfer roller 405 for discharging the film to the next process part, at opposite edges thereon. Also, the frame 401 has a leg 402 for fixedly supporting the frame on the ground and a caster 403 for readily carrying the frame, on the outer surface of the bottom at each corner.

The drying apparatus frame 401, sectioned into three chambers, has a heating chamber 410 at a middle position and a drying chamber 420 at an upper position. The heating chamber 410 has a heating means (not shown), such as an electric heater, therein. In the drying chamber 420, a larger member of conveying rollers 421 than that of the conveying rollers installed in other apparatuses are arranged at regular intervals at upper and lower positions in an alternating manner, so that a conductive metal-plated film 7 introduced from the introducing transfer roller 404 is completely dried while traveling a zigzag path in upward and downward directions within the solution. After being completely dried, the conductive metal-plated film 7 is discharged to the next process by the discharging transfer roller 405.

Auxiliary Operating Part 90, Positioned Between Predetermined Process Parts, for Aiding to Convey the Film 5 Over all Processes One or more auxiliary operating parts 90 are provided just after predetermined process parts from the degreasing process part 10 to the drying process part 80, so as to facilitate the transportation of the film over all processes.

The auxiliary operating part 90, as shown in FIG. 5, comprises a driving roller 610 and a plurality of driven rollers 620, which are supported by axles fixed above the frame on which the auxiliary operating part 90 is to be installed. The driving and driven rollers are arranged to form a zigzag traveling path of the film 5. The driving roller 610 is rotated as an auxiliary driving motor 630 operates, because the axis of the driving roller 610 is connected to the rotation axis of the auxiliary driving motor 630. Transported by the driving roller 610, the film 5 is allowed to proceed to rotate the driven rollers 620. In concert with the driving roller 610, the driven rollers 620 function to transport the film 5 without distorting the film.

The auxiliary operating part 90, as shown in FIGS. 1 and 5, may be positioned between the washing apparatus 32 of the neutralizing process part 30 and the coupling apparatus 41 of the coupling process part 41 and/or between the washing apparatus 73 of the plating process part 70 and the drying apparatus 400 of the drying process part 80, or at other positions.

Winding Process Part 3 for Winding the Dried Conductive Metal-Plated Film 7 Around a Taking-Up Roller 460

In the winding process part 3, a winding apparatus 500 is used to wind around a taking-up roller 560 the conductive metal-plated film 7 which emerges as the final product from the drying apparatus 400.

The structure of the winding apparatus 500 is shown in FIG. 7.

Housing the winding apparatus 500, a frame 501 in the form of a rectangular parallelepiped has a leg 502 for fixedly supporting the frame on the ground and a caster 503 for readily carrying the frame, on the outer surface of the bottom at each corner.

A plurality of conveying rollers 510 are provided at predetermined upper positions above an inlet inside the frame 501 so as to keep the introduced conductive metal-plated film 7 stably without being twisted or distorted.

Next to the conveying rollers 510, a tension controlling assembly is provided for controlling the tension of the conductive metal-plated film 7. The tension controlling assembly comprises a pair of spaced, fixed roller 520, with a movable roller 530 positioned therebetween. The movable roller 530 is fixed on an axle engaged with a movable rack 531 which is combined with a pair of vertically parallel guide rails 540 so that the movable rack 531 moves up and down along the guide rails 540, thereby controlling the elevation of the movable rollers 530.

Next to the tension controlling assembly, a table 552 is provided, with a diverting roller 550 and a discharging roller 551 installed at opposite ends thereon.

Beside the table 552, a taking-up roller mounting stand 560 is provided for detachably mounting a release paper-feeding roller 580 and a taking-up roller 570 at an upper and a lower position thereof. The release paper-feeding roller 580 functions to supply release paper 8 while the taking-up roller 570 winds the conductive metal-plated film 7 in association with the release paper 8 therearound.

At a lower site inside the table 552, a driving motor is installed to rotate the axis of the taking-up roller 570 in combination with a power transmission means, such as a pulley, a belt, a sprocket, or a chain.

Particularly, the conveying rollers 211, the washing rollers 320 and the draining rollers 330, which are installed in the decreasing apparatus 11 and the washing apparatus 12 of the degreasing process part 10, in the first and the second etching apparatus 23, 25 and the washing apparatuses 24, 26, in the neutralizing apparatus 31 and the washing apparatus 32 of the neutralizing process part 30, in the coupling apparatus 41 and the acid-washing apparatus 42 of the coupling process part 40, in the activating apparatus 51 and the washing apparatus 52 of the catalyst-adding process part 50, in the underplating apparatus 61 and the washing apparatus 62 of the underplating process part 60, and in the electroplating apparatus 71 and the washing apparatus 72 of the plating process part 70, have various types of grooves formed thereon, as shown in FIGS. 8A to 13b, so as to prevent the film 5 from slipping during transportation.

FIGS. 8a and 8b show a first embodiment, suitable for use as the conveying rollers 211, the washing rollers 320, and the draining rollers 330, having a regular pattern of grooves G formed on the circumferential surface C thereof, in a perspective view and a front view, respectively.

As shown in the perspective view of FIG. 8a, a groove G with a predetermined width is formed on the circumferential surface C of the conveying roller 211, the washing roller 320, and the draining roller 330, spiraling clockwise from one end to the other. After spiral turns, the grooves G on a surface are arranged at regular intervals, with a prominence P formed therebetween.

Thus, as seen in the front view of FIG. 8b, a plurality of grooves G is carved in the form of a letter 'S' at regular intervals.

FIGS. 9a and 9b show a second embodiment, suitable for use as the conveying rollers 211, the washing rollers 320, and the draining rollers 330, having a regular pattern of grooves G formed on the circumferential surface C thereof, in a perspective view and a front view, respectively.

As shown in the perspective view of FIG. 9a, grooves G in the form of a letter 'V', each extending from one end of the roller to the other end, with a pointed-end positioned at the middle, are formed at regular intervals in a radial direction on the circumferential surface C of the conveying roller 211, the washing roller 320, and the draining roller 330, with a prominence P formed therebetween.

FIGS. 10a and 10b are a perspective view and a front view, respectively, showing a third embodiment, suitable for use as the conveying rollers 211, the washing rollers 320, and the draining rollers 330, having a regular pattern of grooves G formed on the circumferential surface C thereof.

In this embodiment, a first groove G1 and a second groove G2 are formed on the circumferential surface C of the conveying roller 211, the washing roller 320, and the draining roller 330, spiraling clockwise and counterclockwise from one end of the cylindrical surface of the roller to the other, respectively. After spiral turns, the grooves G1, G2 on a surface are arranged at regular intervals to repetitively form a letter 'X' at predetermined positions, with a prominence P formed therebetween.

Thus, as seen in the front view of FIG. 10b, the first groove G1 and the second groove G2 meet each other at both a lower and an upper line of the circumferential surface of the roller, together forming a sine wave.

FIGS. 11a and 11b are a perspective view and a front view, respectively, showing a fourth embodiment, suitable for use as the conveying rollers 211, the washing rollers 320, and the draining rollers 330, having a regular pattern of grooves G formed on the circumferential surface C thereof.

In this embodiment, grooves G in the form of a line '-', each extending from one end of the roller to the other end, are formed at regular intervals in a radial direction on the circumferential surface C of the conveying roller 211, the washing roller 320, and the draining roller 330, with a prominence P formed therebetween.

As shown above (in FIGS. 8a and 8b, 9a and 9b, 10a and 10b, 11a and 11b), the grooves on respective circumferential surface of the conveying roller 211, the washing roller 320, and the draining roller 330 may be carved in various forms, such as letters 'V', 'U', etc.

Figure 12A:
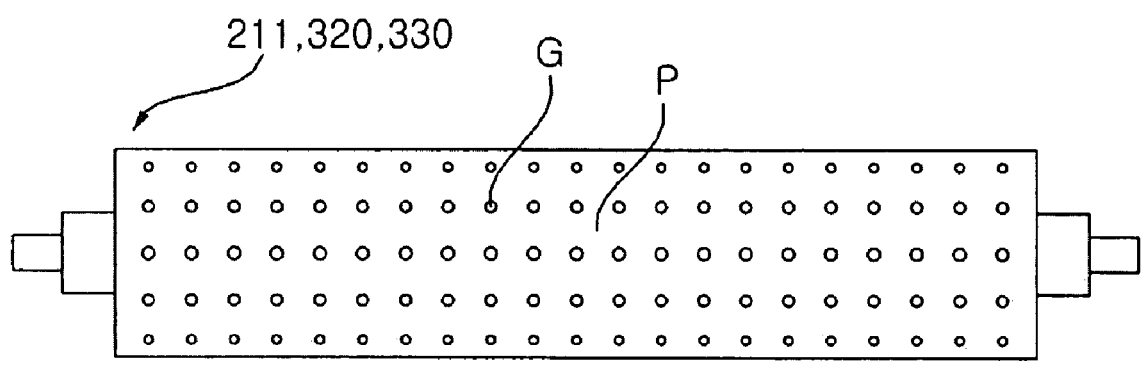

FIGS. 12a and 12b are a perspective view and a front view, respectively, showing a fifth embodiment, suitable for use as the conveying rollers 211, the washing rollers 320, and the draining rollers 330, having a regular pattern of grooves G formed on the circumferential surface C thereof.

In this embodiment, a plurality of circular grooves G, each having a predetermined depth and a predetermined diameter, is formed in both a lengthwise direction and a radial direction at regular intervals over the entire surface of the conveying roller 211, the washing roller 320, and the draining roller 330, with a prominence P formed therebetween.

FIGS. 13a and 13b show a sixth embodiment, suitable for use as the conveying rollers 211, the washing rollers 320, and the draining rollers 330, having a regular pattern of grooves G formed on the circumferential surface C thereof, in a perspective view and a front view, respectively.

As shown in the perspective view of FIG. 13a, a plurality of prominences, each being a semi-circular cylinder with a cross section of a semi circle and extending from one end of the roller to the other end, are formed in a radial direction on the circumferential surface C of the conveying roller 211, the washing roller 320, and the draining roller 330, with a groove G formed therebetween.

That is, curved prominences P and grooves G are arranged in an alternating manner in a radial direction, so that the curved prominences appear as rectangles and the grooves look like lines, as shown in FIG. 12b.

Below, a description will be given of the operation principle of the electroless metal film-plating system 1 according to the present invention.

In the electroless metal film-plating system 1, as shown in FIG. 2, the substrate roll-mounting stand 110 provided in the taking-out apparatus 100 of the unwinding process part 2 has the release paper-recovering roller 112 for winding paper 6 released from the film 5 and the mounted substrate roller 111 around which the film 5 backed by the release paper 6 is wound.

The film 5, after being taken out by rotating the substrate roller 111, is installed on the supply-guiding roller 120, the diverting roller 130, the fixed rollers 140 and the movable rollers 150 in order, while the striped release paper 8 is wound around the release paper-recovering roller 112.

The film 5 emerging from the taking-out apparatus 100 is installed in the etching process part 20, the neutralizing process part 30, the coupling process part 40, the catalyst-adding process part 50, the underplating process part 60, the plating process part 70, the drying apparatus 400 of the drying process part 80, and the winding apparatus 500 of the winding process part 3, in order.

Prior to switching the system on, release paper 8 is fed from the release paper-feeding roller 580 to the film 5, such that the release paper 8 backs the conductive metal-plated polyimide substrate 7 during the operation of the system while being wound around the taking-up roller 570.

After the film 5 is installed in all process parts in order, the positions of the movable rollers 150, 530 are adjusted by moving the movable rack 151 of the unwinding apparatus 100 and the movable rack 531 of the winding apparatus 500 upwards or downwards to set a proper tension over the whole length of the film 5. The completion of the tension control is followed by starting the operation of the system.

If the system is switched on, the driving motor 113 of the unwinding process part 2 operates to rotate the substrate roller 111 to take out the film 5 while the release paper-recovering roller 112 winds the release paper 6 stripped from the film 5 therearound. Also, the auxiliary driving motor 630 of each auxiliary operating process part 90 operates to rotate the driving roller 610 so as to facilitate the transportation of the film 5. As a driving motor of the winding process part 3 operates, the taking-up roller 570 is rotated to wind the conductive metal-plated film 7 in association with the release paper 8 therearound, while the conductive metal-plated film 7 and the release paper are kept tight.

In the taking-out apparatus 100 of the unwinding process part 2, the film emerging from the substrate roller 11 is horizontally guided by the supply-guiding roller 120 and is allowed to pass through the end-connecting unit 170 and to be diverted upwards by a diverting roller 130. After traveling the fixed rollers 140 and movable rollers 150 in a zigzag path, the film 5 is fed to the degreasing apparatus 11 of the degreasing process part 10, with the concomitant winding of the release paper 6 stripped from the substrate roller 111 around the release paper-recovering roller 112.

As soon as it is introduced into the degreasing apparatus 11 of the degreasing process part 10 by the transfer roller 205, as shown in FIG. 3, the film 5 enters the degreasing solution 250 (alkaline rinse or shampoo) contained in the bath 210. The film 5 travels a zigzag path along the conveying rollers 210 so that impurities such as contaminants, oils, fingerprints, etc. are removed from the surface of the film 5.

The impurity-removed film 5 moves upwards and passes between two wringing rollers 231 of the wringing means 230. The degreasing solution on the film 5 is drained by the wringing rollers 231. Thereafter, the film 5, from which impurities and the degreasing oil haven been removed, is transferred to the washing apparatus 12 by the transfer roller 206.

After being introduced into the washing apparatus 12, the degreased film 5 is repetitively immersed in and drawn from the washing solution 340 contained in the first, the second and the third washing chamber 311, 312, 313 of the washing bath 310 in an alternating manner, while traveling the path according to the washing rollers 320 submerged in the washing water 340 in each washing chamber and the draining rollers 330 provided above the partitions 314.

Particularly, the film 5 introduced into the first washing chamber 311 is allowed to pass between the spraying nozzles 361 and 362 so as to completely wash off the degreasing solution from the opposite surfaces of the film 5 with the water sprayed from the nozzles 361 and 362.

After traveling the washing roller 320 of the third washing chamber 313, the film 5 moves upwards, and then passes between the wringing rollers 371 and 372 of the wringing means 370. Since the wringing rollers 371 and 372 are made of resilient, absorptive soft material, such as sponge or foam resin, water is completely removed from the surface of the film 5 during the passage of the film 5 therebetween.

Following the washing process, the film 5 is transferred to the subsequent etching process part 20 by a transfer roller 380.

The etching process part 20 is divided into a first etching process part 21 and a second etching process part 22. For the first etching process part 21, as shown in FIG. 3, a first etching apparatus 23 and a washing apparatus 24 are employed while the second etching process part 22 is operated by a second etching process 25 and a washing apparatus 26. In this embodiment, etching is carried out in a dual manner using both a first and a second etching solution 250, which are contained in the liquid baths of the first and the second etching apparatus 23, 25, respectively.

From the washing apparatus 12 of the degreasing process part 10, the degreased film 5 is sequentially introduced into the first etching apparatus 23 and the washing apparatus 24 of the first etching process part 21.

In the liquid bath 210 of the first etching apparatus 23, the film 5 is primarily etched with the first etching solution while moving upwards and downwards repetitively along the conveying rollers 211 submerged in the first etching solution. Thereafter, the film 5 is allowed to pass between the rollers 231 of the wringing means 230 to spread the first etching solution uniformly over the surface thereof.

Subsequently, the film 5 is introduced into the washing apparatus 24 wherein it is repetitively immersed in and drawn from the washing solution 340 contained in the first, the second and the third washing chamber 311, 312, 313 of the washing bath 310, in an alternating manner, while traveling the path according to the washing rollers 320 submerged in the washing water 340 in each washing chamber and the draining rollers 330 provided above the partitions 314.

Particularly, the film 5 introduced into the first washing chamber 311 is allowed to pass between the spraying nozzles 361 and 362 of the spraying washing means 360 so as to completely wash off the degreasing solution from the opposite surfaces of the film 5 with the water sprayed from the nozzles 361 and 362.

After traveling the washing roller 320 of the third washing chamber 313, the film 5 moves upwards, and then passes between the wringing rollers 371 and 372 of the wringing means 370. Since the wringing rollers 371 and 372 are made of resilient, absorptive soft material, such as sponge or foam resin, water is completely removed from the surface of the film 5 during the passage of the film 5 therebetween.

Following the first etching process, the film 5 is transferred to the second etching process part 22 by the transfer roller 380.

In the liquid bath 210 of the second etching apparatus 25, the film 5 is secondarily etched with the second etching solution while moving upwards and downwards repetitively along the conveying rollers 211 submerged in the second etching solution. Thereafter, the film 5 is allowed to pass between the rollers 231 of the wringing means 230 to spread the second etching solution uniformly over the surface thereof.

After completion of the secondary etching process, the film 5 is introduced into the washing apparatus 26 wherein it is repetitively immersed in and drawn from the washing solution 340 contained in the first, the second and the third washing chamber 311, 312, 313 of the washing bath 310, in an alternating manner, while traveling the path according to the washing rollers 320 submerged in the washing water 340 in each washing chamber and the draining rollers 330 provided above the partitions 314.

Particularly, the secondarily etched film 5 introduced into the first washing chamber 311 of the washing apparatus 26 is allowed to pass between the spraying nozzles 361 and 362 of the spraying washing means 360 so as to completely wash off the first etching solution from the opposite surfaces of secondarily etched film 5 with the water sprayed from the nozzles 361 and 362.

After traveling the washing roller 320 of the third washing chamber 313, the secondarily etched film 5 moves upwards, and then passes between the wringing rollers 371 and 372 of the wringing means 370. Since the wringing rollers 371 and 372 are made of resilient, absorptive soft material, such as sponge or foam resin, water is completely removed from the surface of the film 5 during the passage of the film 5 therebetween.

Into the neutralizing process part 30, comprised, as shown in FIG. 3, of the neutralizing apparatus 31 and the washing apparatus 32, the film 5 etched in the second etching process part 22 is introduced.

In the liquid bath 210 of the neutralizing apparatus 31, the secondarily etched film 5 is neutralized with an acidic or alkaline neutralizing solution while moving upwards and downwards repetitively along the conveying rollers 211 submerged in the neutralizing solution. Thereafter, the film 5 is allowed to pass between the rollers 231 of the wringing means 230 to spread the neutralizing solution uniformly over the surface thereof.

After the completion of neutralization, the film 5 is introduced into the washing apparatus 32 wherein it is repetitively immersed in and drawn from the washing solution 340 contained in the first, the second and the third washing chamber 311, 312, 313 of the washing bath 310 in an alternating manner while traveling the path according to the washing rollers 320 submerged in the washing water 340 in each washing chamber and the draining rollers 330 provided above the partitions 314.

Particularly, the secondarily etched film 5 introduced into the first washing chamber 311 of the washing apparatus 26 is allowed to pass between the spraying nozzles 361 and 362 of the spraying washing means 360 so as to completely wash off the first etching solution from the opposite surfaces of the secondarily etched film 5 with the water sprayed from the nozzles 361 and 362.

After traveling the washing roller 320 of the third washing chamber 313, the neutralized film 5 moves upwards, and then passes between the wringing rollers 371 and 372 of the wringing means 370. Since the wringing rollers 371 and 372 are made of resilient, absorptive soft material, such as sponge or foam resin, water is completely removed from the surface of the film 5 during the passage of the film 5 therebetween.

Powered by the auxiliary operating process part 90, the neutralized film 5 is allowed to enter the coupling process part 40 comprised of the coupling apparatus 41 and the acid-washing apparatus 42 as shown in FIG. 3.

In the liquid bath 210 of the coupling apparatus 41, the neutralized film 5 is polarized with a silane- or amine-based coupling solution 250 while moving upwards and downwards repetitively along the conveying rollers 211 submerged in the coupling solution 250. Thereafter, the film 5 is allowed to pass between the rollers 231 of the wringing means 230 to spread the catalyst solution uniformly over the surface thereof.

The polarization is followed by the introduction of the film 5 into the acid-washing apparatus 42, wherein it is repetitively immersed in and drawn from an acidic solution 340 contained in the first, the second and the third acid-washing chamber 311, 312, 313 of the washing bath 310, in an alternating manner, while traveling the path according to the washing rollers 320 submerged in the washing solution 340 in each washing chamber and the draining rollers 330 provided above the partitions 314.

Particularly, the polarized film 5 introduced into the first washing chamber 311 of the acid washing apparatus 42 passes between the spraying nozzles 361 and 362 of the spraying washing means 360 so as to completely wash off the acidic washing solution from the opposite surfaces of the film 5 with the water sprayed from the nozzles 361 and 362.

After traveling the washing roller 320 of the third washing chamber 313, the polarized film 5 moves upwards, and then passes between the wringing rollers 371 and 372 of the wringing means 370. Since the wringing rollers 371 and 372 are made of resilient, absorptive soft material, such as sponge or foam resin, water (moisture) is completely removed from the surface of the film 5 during the passage of the film 5 therebetween.

Subsequently, the polarized film 5 is introduced into the catalyst-adding process part 50 comprising, as shown in FIG. 3, the activating apparatus 51 and the washing apparatus 52.

In the liquid bath 210 of the activating apparatus 51, the polarized film 5 is coated with a metal catalyst while moving upwards and downwards repetitively along the conveying rollers 211 submerged in the catalyst solution 250. Thereafter, the film 5 is allowed to pass between the rollers 231 of the wringing means 230 to spread the catalyst solution uniformly over the surface thereof.

The adsorption of the catalyst is followed by the introduction of the film 5 into the washing apparatus 52 wherein it is repetitively immersed in and drawn from an washing solution 340 contained in the first, the second and the third washing chamber 311, 312, 313 of the washing bath 310, in an alternating manner, while traveling the path defined by the washing rollers 320 submerged in the washing solution 340 in each washing chamber and the draining rollers 330 provided above the partitions 314.

Particularly, the catalyst-adsorbed film 5 introduced into the first washing chamber 311 of the washing apparatus 52 passes between the spraying nozzles 361 and 362 of the spraying washing means 360 so as to completely wash off the catalyst solution from the opposite surfaces of the film 5 with the water sprayed from the nozzles 361 and 362.

After traveling the washing roller 320 of the third washing chamber 313, the activated film 5 moves upwards, and then passes between the wringing rollers 371 and 372 of the wringing means 370. Since the wringing rollers 371 and 372 are made of resilient, absorptive soft material, such as sponge or foam resin, the washing water (moisture) is completely removed from the surface of the film 5 during the passage of the film 5 therebetween.

Thereafter, the activated film 5 enters the underplating process part 60 comprised, as shown in FIG. 3, of the underplating apparatus 61 and the washing apparatus 62, wherein a undercoat (first conductive metal film) is formed on the film 5.

In the liquid bath 210 of the underplating apparatus 61, the activated film 5 is plated with the underplating solution 250 while moving upwards and downwards repetitively along the conveying rollers 211 submerged in the underplating solution 250. Thereafter, the film 5 is allowed to pass between the rollers 231 of the wringing means 230 to spread the underplating solution uniformly over the surface thereof.

The underplated film 5 is introduced into the washing apparatus 62 wherein it is repetitively immersed in and drawn from an washing solution 340 contained in the first, the second and the third washing chamber 311, 312, 313 of the washing bath 310 in an alternating manner while traveling the path defined by the washing rollers 320 submerged in the washing solution 340 in each washing chamber and the draining rollers 330 provided above the partitions 314.

Particularly, when the underplated film 5 introduced into the first washing chamber 311 of the washing apparatus 62 passes between the spraying nozzles 361 and 362 of the spraying washing means 360, the underplating solution is completely washed off from the opposite surfaces of the film 5 with the water sprayed from the nozzles 361 and 362.

After traveling the washing roller 320 of the third washing chamber 313, the underplated film 5 moves upwards, and then passes between the wringing rollers 371 and 372 of the wringing means 370. Since the wringing rollers 371 and 372 are made of resilient, absorptive soft material, such as sponge or foam resin, the washing water (moisture) is completely removed from the surface of the film 5 during the passage of the film 5 therebetween.

Next, the underplated (first conductive metal film-formed) film 5 enters the plating process part 70 comprised, as shown in FIG. 3, of the plating apparatus 71 and the washing apparatus 72, wherein a metal coat (second conductive metal film) is formed on the film 5.

In the liquid bath 210 of the plating apparatus 71, the film 5 is plated with the plating solution 250 while moving upwards and downwards repetitively along the conveying rollers 211 submerged in the plating solution 250. Thereafter, the film 5 is allowed to pass between the rollers 231 of the wringing means 230 to spread the plating solution uniformly over the surface thereof.

The plated film 5 is introduced into the washing apparatus 72 wherein it is repetitively immersed in and drawn from an washing solution 340 contained in the first, the second and the third washing chamber 311, 312, 313 of the washing bath 310, in an alternating manner, while traveling the path defined by the washing rollers 320 submerged in the washing solution 340 in each washing chamber and the draining rollers 330 provided above the partitions 314.

Particularly, when the plated film 5 introduced into the first washing chamber 311 of the washing apparatus 72 passes between the spraying nozzles 361 and 362 of the spraying washing means 360, the plating solution is completely washed off from the opposite surfaces of the film 5 with the water sprayed from the nozzles 361 and 362.

After traveling the washing roller 320 of the third washing chamber 313, the plated film 5 moves upwards, and then passes between the wringing rollers 371 and 372 of the wringing means 370. Since the wringing rollers 371 and 372 are made of resilient, absorptive soft material, such as sponge or foam resin, the washing water (moisture) is completely removed from the surface of the film 5 during the passage of the film 5 therebetween.

Powered by the auxiliary operating process part 90, the conductive metal-plated film 7 thus obtained is allowed to enter the drying process part 80 as shown in FIG. 6.

After being introduced into the drying apparatus 400 of the drying process part 80, the conductive metal-plated film 7 is dried while traveling a vertically zigzagged path along the conveying rollers 421 in the drying chamber 420. In this regard, the heat generated from a heater (not shown) of the heating chamber 410 is transferred to the drying chamber 420 to dry the conductive metal-plated film 7.

After being completely dried during the passage through the drying apparatus 400, the conductive metal-plated film 7 is advanced to the winding apparatus 500 of the winding process part 5 by the transfer roller 405.

After being introduced into the winding apparatus 500 of the winding process part 3, the conductive metal-plated film 7 comes to stand right while traveling a vertically zigzagging path along a plurality of conveying rollers 510 installed at the inlet. Thereafter, the conductive metal-plated film 7 passes a vertically zigzagging path defined by the fixed rollers 520 and the movable rollers 530 and is supported by the diverting roller 550 and the discharging roller 551 mounted on the table 552, followed by winding the film around the taking-up roller driven by the driving motor 553.

When the conductive metal-plated film 7 emerging from the discharging roller 551 is wound around the taking-up roller 570, the release paper 8 is rolled out from the release paper-feeding roller 580 and rewound around the taking-up roller 570, backing the conductive metal-plated film 7.

In the electroless conductive metal film-plating system according to the present invention, a copper-coated polyimide film can be efficiently produced as the apparatuses of each process part operate.

Particularly, the polyimide film can be conveyed safely when it is in close contact with the surface of the roller. However, most conventional rollers transport polyimide films, with liquid remaining between the rollers and the polyimide films. Thus, friction therebetween is occasionally weakened, allowing the films to slip from the rollers.

In contrast, the conveying rollers 211, the washing rollers 320 and the draining rollers 330, installed in the degreasing apparatus 11 and the washing apparatus 12 of the degreasing process part 10, in the first and the second etching apparatus 23, 25 and the washing apparatuses 24, 26 of the first and the second etching process part 21, 22, in the neutralizing apparatus 31 and the washing apparatus 32 of the neutralizing process part 30, in the coupling apparatus 41 and the acid-washing apparatus 42 of the coupling process part 40, in the activating apparatus 51 and the washing apparatus 52 of the catalyst-adding process part 50, in the underplating apparatus 61 and the washing apparatus 62 of the underplating process part 60, and in the plating apparatus 71 and the washing apparatus 72 of the plating process part 70, are structured as is seen in FIGS. 8a to 13b, thereby preventing the film from slipping from the rollers. That is, even if the polyimide film travels the rollers submerged in liquid, it can be in close contact with the surface of the rollers because the liquid is drained through the grooves formed on the surface. Thus, the polyimide film is safely supported by the prominences of the rollers, thereby safely proceeding along the paths on the rollers.

In addition, the drained amount of liquid can be controlled by modulating the depth of the grooves formed on the rollers.

As such, the grooves formed on the surface of the rollers in accordance with the present invention function to drain liquid therethrough from the surface of the rollers and to maintain the friction between the film and the rollers even when the film travels on the rollers submerged in liquid, thereby preventing the film from slipping or departing from the rollers. In consequence, the electroless conductive metal film-plating system according to the present invention can bring an improvement in process reliability.

In the electroless metal film-plating system according to the present invention, as described hereinbefore, polyimide film is continuously fed from a roll and the degreasing process part, the etching process part, the neutralizing process part, the coupling process part, the catalyst-adding process part, the undercoating process, and the plating process part are conducted, in order, so as to plate one or both surfaces of the film with conductive metal, followed by drying the conductive metal-plated film in the drying process part and taking up the plated film into a roll in the winding process part. A wetting process, in which the film passes through a liquid solution and is repetitively immersed in and drawn from a washing solution, is applied to all process parts, several parts notwithstanding, to produce a bilayer structure FCCL exhibiting superior physical properties such as peel strength. Also, after immersion in liquid in each process, the liquid is removed using wringing rollers so as to coat the material of interest at a uniform thickness. In the unwinding process for feeding the film and the winding process for taking up the film, roller assemblies comprising a plurality of fixed rollers and a plurality of movable rollers are employed to control the tension of the film, thereby transporting the film without causing twisting or distortion. In addition, one or more auxiliary operating process parts are provided to facilitate the transfer of the film.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A metal film-plating system, comprising:
   an unwinding apparatus configured to provide a film;
   a degreasing apparatus configured to remove impurities from the film;
   an etching apparatus configured to perform an etching process on the film;
   a neutralizing apparatus configured to perform a neutralizing process on the film;
   a coupling apparatus configured to couple the film with a coupling agent;
   a catalyst-adding apparatus configured to adsorb a catalyst onto the film;
   an underplating apparatus configured to perform an underplating process on the film; and
   a plating apparatus configured to perform a plating process on the film,
   wherein at least one of the unwinding apparatus, the degreasing apparatus, the etching apparatus, the neutralizing apparatus, the coupling apparatus, the catalyst-adding apparatus, the underplating apparatus, and the plating apparatus, includes a wetting apparatus configured to perform a wetting operation,
   wherein the unwinding apparatus is further configured to unwind the film from a predetermined backing, and
   wherein the unwinding apparatus comprises:
   a rectangular parallelepiped housing frame;
   a substrate roll-mounting stand having a release paper-recovering roller and a substrate roller detachably mounted at an upper and a lower position of the substrate roll-mounting stand;
   a table having a supply-guiding roller, an end-connecting unit, and a diverting roller formed at an upper position of the table;
   a driving motor configured to rotate the substrate roller; and
   a tension controlling assembly configured to control a tension of the film.

2. The metal film-plating system according to claim 1, wherein the wetting apparatus includes at least one of a conveying roller, a washing roller and a draining roller.

3. The metal film-plating system according to claim 2, wherein at least one of the conveying roller, the washing roller and the draining roller has a plurality of grooves disposed at regular intervals on a circumferential surface thereof.

4. The metal film-plating system according to claim 3, wherein the plurality of grooves spiral clockwise from one end of a corresponding roller to the other end of the corresponding roller.

5. The metal film-plating system according to claim 3, wherein the plurality of the grooves are carved in the form of the letter 'V' at regular intervals in a radial direction on the circumferential surface of a corresponding roller, each groove extending from one end of the corresponding roller to the other end of the corresponding roller and having a pointed end positioned at a middle of the corresponding roller.

6. The metal film-plating system according to claim 3, wherein the plurality of the grooves include a first groove G1 and a second groove G2, which spiral clockwise and counterclockwise from one end of a corresponding roller to the other end of the corresponding roller, respectively, and
   wherein the grooves G1 and G2 are arranged at regular intervals to repetitively form the letter 'X' at predetermined positions after spiral turns.

7. The metal film-plating system according to claim 3, wherein the plurality of grooves are carved in the form of a line '-' at regular intervals in a radial direction on the circumferential surface of a corresponding roller, each groove extending from one end of the corresponding roller to the other end of the corresponding roller with a prominence formed between the plurality of grooves.

8. The metal film-plating system according to claim 3, wherein the plurality of the grooves are circles, each having a predetermined depth and predetermined diameter, and which are arranged in both a lengthwise direction and a radial direction at regular intervals over an entire surface of a corresponding roller with a prominence formed therebetween.

9. The metal film-plating system according to claim 3, wherein the plurality of grooves are arranged, along with curved prominences, in an alternating manner in a radial direction on the circumferential surface of a corresponding roller, each prominence being a semicircular cylinder with a cross-section of a semicircle and extending from one end of the corresponding roller to the other end of the corresponding roller.

10. The metal film-plating system according to claim 1, wherein:
the degreasing apparatus is further configured to remove the impurities from the film by degreasing and washing the film,
the etching apparatus includes first and second etching apparatuses configured to etch and wash the film,
the neutralizing apparatus is further configured to neutralize and wash the film,
the coupling is further configured to couple the neutralized film and to wash the film with acid,
the catalyst-adding apparatus includes an activating apparatus configured to adsorb the catalyst onto the film and to wash the film,
the underplating apparatus is further configured to form a first conductive metal film on the film and to wash the film, and
the plating apparatus is further configured to form a second conductive metal film on the first conductive metal film and to wash the film.

11. The metal film-plating system according to claim 10, further comprising:
a drying apparatus configured to dry the second conductive metal film;
an auxiliary operating apparatus positioned between predetermined process apparatuses and configured to power the film traveling over the predetermined apparatuses; and
a winding apparatus configured to wind the film.

12. The metal film-plating system according to claim 10, wherein at least one of the degreasing apparatus, the first etching apparatus, the second etching apparatus, the neutralizing apparatus, the coupling apparatus, the activating apparatus, the underplating apparatus and the plating apparatus comprises:
a rectangular parallelepiped housing frame;
a top-open liquid bath supported on a stand at an upper position of the housing frame;
a liquid material contained in the liquid bath;
a plurality of conveying rollers arranged within the liquid material at upper and lower positions in an alternating manner;
a wringing mechanism including a pair of rollers provided above a surface of the liquid material subsequently to the conveying rollers; and
two transfer rollers provided at opposite upper ends of the housing frame, each roller including a cover.

13. The metal film-plating system according to claim 10, wherein each of the degreasing apparatus, the first etching apparatus, the second etching apparatus, the neutralizing apparatus, the coupling apparatus, the catalyst-adding apparatus, the underplating apparatus and the plating apparatus includes a washing apparatus, and
wherein the washing apparatus comprises:
a washing apparatus housing frame sectioned into three spaces by two horizontal supports;
a washing bath divided into first, second and third washing chambers by partitions and configured to contain washing water;
a pumping motor configured to supply the washing water to the washing bath;
a roller assembly including washing rollers provided in each of the first, second and third washing chambers at such a position as to sufficiently submerge the film in the washing water, and a draining roller provided above each of the partitions;
a spray washing mechanism and a wringing mechanism respectively provided in an inlet and an outlet of the first, second and third washing chambers; and
two transfer rollers provided at opposite upper ends of the housing frame, each roller including a cover.

14. The metal film-plating system according to claim 11, wherein the drying apparatus includes:
a rectangular parallelepiped housing frame;
an introducing transfer roller configured to introduce the film into the drying apparatus and a discharging transfer roller configured to discharge the film to a next process part, at opposite edges thereon;
a heating chamber at a middle position and a drying chamber at an upper position; and
a heating mechanism in the heating chamber and a plurality of conveying rollers arranged at regular intervals at upper and lower positions in an alternating manner within the drying chamber.

15. The metal film-plating system according to claim 11, wherein the winding apparatus includes:
a rectangular parallelepiped housing frame;
a plurality of conveying rollers provided at predetermined upper positions above an inlet inside the housing frame;
a tension controlling assembly provided next to the plurality of conveying rollers;
a table disposed near an outlet of the tension controlling assembly and including a diverting roller and a discharging roller installed at opposite ends of the table;
a taking-up roller mounting stand disposed next to the table and configured to detachably mount a release paper-feeding roller and a taking-up roller at an upper and a lower position thereof respectively; and
a driving motor at a lower position inside the table and configured to rotate an axis of the taking-up roller.

16. The metal film-plating system according to claim 11, wherein the auxiliary operating apparatus includes:
a driving roller and a plurality of driven rollers supported by axles fixed in a zigzag pattern above a frame on which the auxiliary operating part is to be installed; and
an auxiliary driving motor configured to drive the driving roller.

17. The metal film-plating system according to claim 1, wherein the tension controlling assembly comprises:
a plurality of fixed rollers fixed on shafts which are fixedly arranged at regular intervals at upper positions of the housing frame;
one or more movable rollers, each moving up and down between the fixed rollers, and being fixed on an axle engaged with a movable rack; and
a pair of vertically parallel guide rails associated with the movable rack whereby the movable rack moves up and down along the guide rails to control an elevation of the one or more movable rollers.

18. The metal film-plating system according to claim 13, wherein the spray washing mechanism included in the first washing chamber comprises:

two spraying nozzles facing each other, positioned above a surface of the washing water, ahead of the washing rollers, whereby the film introduced into the first washing chamber is allowed to pass between the spraying nozzles so as to wash opposite surfaces of the film with water sprayed from the nozzles.

19. The metal film-plating system according to claim 13, wherein the wringing mechanism comprises:

a pair of wringing rollers facing each other at an oblique angle, positioned above a surface of the washing water subsequent to the washing rollers in the third washing chamber, whereby the film moving upwards after traveling past the washing rollers is allowed to pass between the wringing rollers, so as to remove water from a surface of the film, wherein the wringing rollers included in the third washing chamber are made of sponge or form resin.

* * * * *